(12) United States Patent
Yen et al.

(10) Patent No.: US 9,093,375 B2
(45) Date of Patent: Jul. 28, 2015

(54) METAL GATE STRUCTURE AND METHOD

(71) Applicant: Taiwan Semiconductor Manufacturing Company, Ltd., Hsin-Chu (TW)

(72) Inventors: Hsiu-Jung Yen, Shuishang Township (TW); Jen-Pan Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/839,631

(22) Filed: Mar. 15, 2013

(65) Prior Publication Data

US 2014/0264624 A1 Sep. 18, 2014

Related U.S. Application Data

(60) Provisional application No. 61/777,916, filed on Mar. 12, 2013.

(51) Int. Cl.
| | |
|---|---|
| *H01L 27/11* | (2006.01) |
| *H01L 21/28* | (2006.01) |
| *H01L 29/49* | (2006.01) |
| *H01L 29/66* | (2006.01) |
| *H01L 49/02* | (2006.01) |
| *H01L 27/06* | (2006.01) |
| *H01L 29/51* | (2006.01) |

(52) U.S. Cl.
CPC ...... *H01L 21/28088* (2013.01); *H01L 27/0629* (2013.01); *H01L 28/24* (2013.01); *H01L 29/4966* (2013.01); *H01L 29/66545* (2013.01); *H01L 29/66583* (2013.01); *H01L 29/517* (2013.01)

(58) Field of Classification Search
CPC .......... H01L 27/00; H01L 29/00; H01L 21/00
USPC ...................... 257/E21.09, E21.352, E29.002, 257/E29.255, 328, 536; 438/237, 382
See application file for complete search history.

(56) References Cited

U.S. PATENT DOCUMENTS

| | | | | |
|---|---|---|---|---|
| 6,406,956 | B1 * | 6/2002 | Tsai et al. | 438/201 |
| 2013/0093024 | A1 * | 4/2013 | Eshun | 257/379 |
| 2013/0126979 | A1 * | 5/2013 | Chern et al. | 257/379 |
| 2013/0168816 | A1 * | 7/2013 | Kang et al. | 257/536 |
| 2013/0277750 | A1 * | 10/2013 | Lai et al. | 257/369 |

* cited by examiner

*Primary Examiner* — Telly Green
(74) *Attorney, Agent, or Firm* — Slater & Matsil, L.L.P.

(57) ABSTRACT

A semiconductor structure comprises a metal gate structure formed in a substrate, wherein the metal gate structure comprises a first film formed of a first material and formed on a bottom and sidewalls of a gate trench, a second film formed of a second material and formed over the first film and a gate electrode formed over the second film. The semiconductor structure further comprises a resistor structure formed in the substrate, where the resistor structure comprises a third film formed of the first material and formed on a bottom and sidewalls of a resistor trench and a fourth film formed of the second material and formed over the third film.

13 Claims, 10 Drawing Sheets

METAL GATE STRUCTURE AND METHOD

This application claims the benefit of U.S. Provisional Application No. 61/777,916 filed on Mar. 12, 2013, entitled "Metal Gate Structure and Method" which is hereby incorporated herein by reference in its entirety.

BACKGROUND

Since the invention of the integrated circuit, the semiconductor industry has experienced rapid growth due to improvements in the integration density of a variety of electronic components (e.g., transistors, diodes, resistors, capacitors, etc.). This improvement in integration density has come from shrinking the semiconductor process node (e.g., shrink the process node towards the sub-20 nm node). As the demand for miniaturization continues, the further shrinking of the process node may increase the complexity of fabricating integrated circuits.

An integrated circuit may comprise a variety of metal oxide semiconductor (MOS) devices. Each MOS device may comprise a substrate layer. A dielectric layer such as a layer of silicon dioxide may be formed on top of the substrate layer. Furthermore, a conductive layer such as a layer of metal or polycrystalline silicon may be deposited on top of the dielectric layer to form a gate structure of the MOS device. In addition, the MOS device may comprise a drain region and a source region. Both regions are highly doped with the same type doping, such as a p-type doping or an n-type doping. Both regions are further connected to two metal contacts to form a drain terminal and a source terminal respectively.

The gate of a MOS device can be formed of either polycrystalline silicon or metal. As semiconductor technologies evolve, MOS devices having a metal gate structure have emerged as an effective solution to further improve the performance of MOS devices. For example, the metal gate structure can reduce the resistance of a gate terminal so as to improve the propagation delay when a gate signal passes through the gate terminal. A variety of metal materials such as tantalum nitride, metal carbide, tantalum, titanium and/or the like can be used to form the gate structure of MOS devices.

Various technologies can be employed to deposit metal materials to form a metal gate structure. Metal materials can be deposited on top of a dielectric layer through a chemical vapor deposition (CVD) process. Alternatively, a metal layer can be formed by a physical vapor deposition (PVD) process. During a PVD process, metal materials are sputtered or vaporized and deposited on the surface of a wafer. The PVD process mainly employs physical processes such as vacuum evaporation or plasma sputter bombardment.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a semiconductor device including a metal gate structure of a metal oxide semiconductor (MOS) transistor device and a resistor. The invention may also be applied, however, to a variety of semiconductor devices. Hereinafter, various embodiments will be explained in detail with reference to the accompanying drawings.

Figure 1:
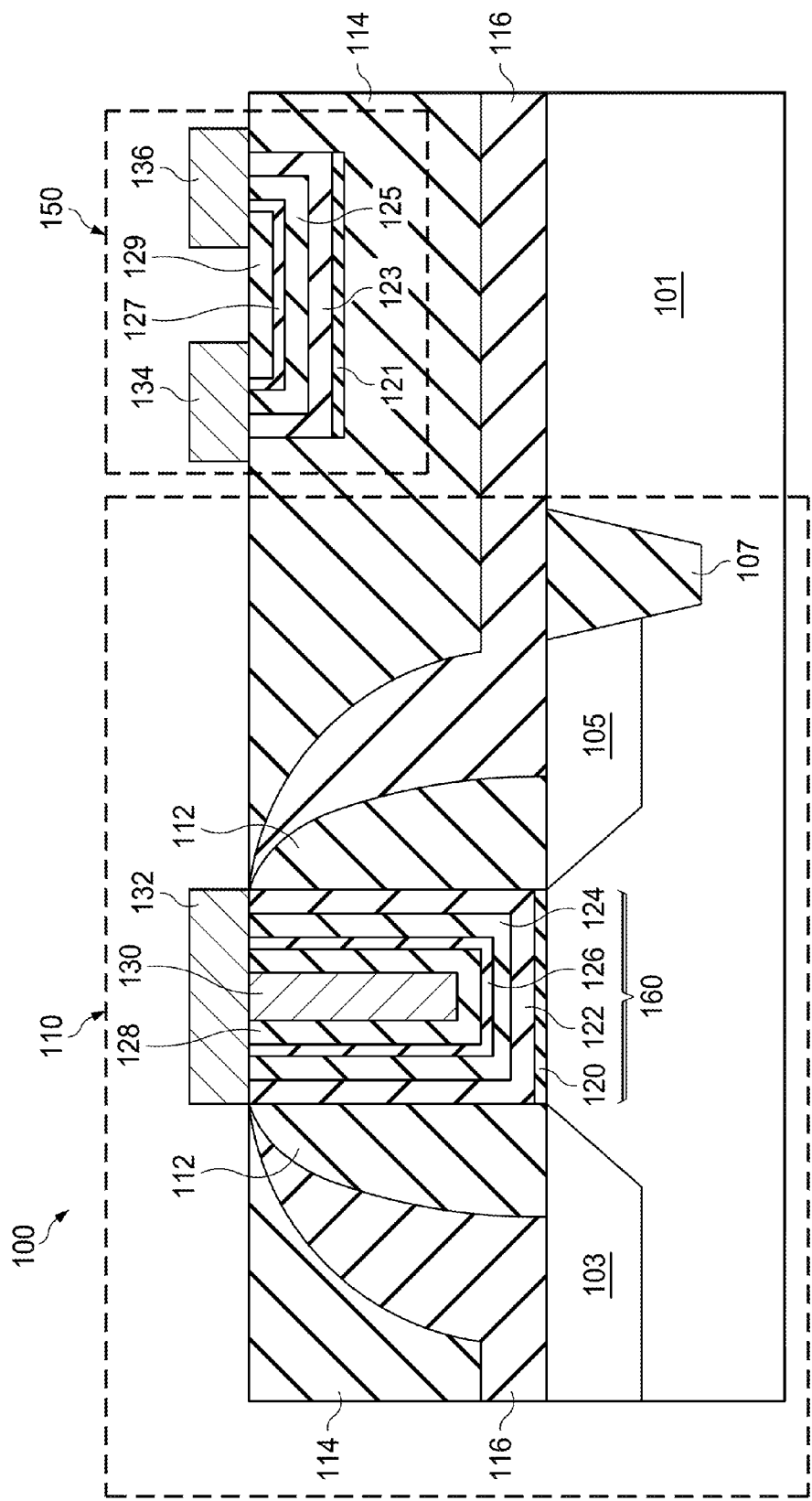
FIG. 1 illustrates a cross sectional view of a semiconductor device in accordance with various embodiments of the present disclosure.

FIG. 1 illustrates a cross sectional view of a semiconductor device in accordance with various embodiments of the present disclosure. The semiconductor device 100 comprises a MOS transistor 110 and a resistor device 150. As shown in FIG. 1, the MOS transistor 110 and the resistor device 150 are formed over a substrate 101. In addition, the fabrication process of the resistor device 150 is integrated with the formation process of the MOS transistor 110. The detailed steps of fabricating the MOS transistor 110 and the resistor device 150 will be described below with respect to FIGS. 2-10.

The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The MOS transistor 110 may comprise a first drain/source region 103 and a second drain/source region 105. The first drain/source region 103 and the second drain/source region 105 may be formed in the substrate 101. In particular, the first drain/source region 103 and the second drain/source region 105 are formed on opposing sides of a metal gate structure 160. In an embodiment in which the substrate 101 is an n-type substrate, the first drain/source region 103 and the second drain/source region 105 may be formed by implanting appropriate p-type dopants such as boron, gallium, indium and/or the like. Alternatively, in an embodiment in which the substrate 101 is a p-type substrate, the first drain/source region 103 and the second drain/source region 105 may be formed by implanting appropriate n-type dopants such as phosphorous, arsenic and/or the like.

The metal gate structure 160 comprises a gate electrode 130 and a plurality of films such as a first film 122, a second film 124, a third film 126 and a fourth film 128 as shown in FIG. 1. Moreover, there may be a barrier layer 120 formed between the metal gate structure 160 and the top surface of the substrate 101.

The barrier layer 120 may be formed by using suitable thermal treatment techniques, wet treatment techniques or deposition techniques such as PVD, CVD, ALD or the like. The barrier layer 120 may be formed of silicon oxide, silicon nitride, silicate based and the like. In accordance with an embodiment, the barrier layer 120 may have a thickness less that 15 angstrom.

The first film 122, the second film 124, the third film 126 and the fourth film 128 may form a composite film surrounding the gate electrode 130. By employing the composite film, some key characteristics of the MOS transistor 110 may be tunable through adjusting the characteristics of the composite film. For example, by employing a composite film with different materials, the characteristics of the metal gate structure 160 such as the gate resistance may change accordingly.

In some embodiments, the first film 122, the second film 124, the third film 126 and the fourth film 128 may be formed of titanium nitride (TiN), tantalum nitride (TaN), titanium aluminide (TiAl), any combinations thereof and the like. Alternatively, the first film 122, the second film 124, the third film 126 and the fourth film 128 may be formed of some suitable dielectric materials such as silicon oxide (SiOx), hafnium oxide (HfOx), lanthanum oxide (LaOx), any combinations thereof and the like.

FIG. 1 illustrates the composite film may comprise four films (e.g., the first film 122) according to an embodiment of the present disclosure. This composite film shown in FIG. 1 is merely an example, which should not unduly limit the scope of the claims. One of ordinary skill in the art would recognize many variations, alternatives, and modifications. For example, the composite film could accommodate any number of films.

The gate electrode 130 may comprise metallic materials such as copper, copper alloys, aluminum, silver, gold and any combinations thereof, and/or multi-layers thereof. Alternatively, the gate electrode 130 may be formed of a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like.

The MOS transistor 110 may further comprise a plurality of gate spacers 112. The gate spacers 112 are used to isolate the metal gate structure 160 from the adjacent semiconductor structures as well as for aligning subsequently formed source and drain regions (e.g., the first drain/source region 103). In accordance with an embodiment, the gate spacers 112 may be formed of silicon nitride. Alternatively, the gate spacer 112 may be formed of nitride or oxide based dielectric materials.

As shown in FIG. 1, there may be a contact etch stop layer (CESL) 116 formed over the gate spacers 112. The CESL layer 116 may comprise commonly used dielectric materials, such as silicon nitride, silicon oxynitride, silicon oxycarbide, silicon carbide, combinations thereof, and multi-layers thereof. The CESL layer 116 is deposited over the semiconductor device through suitable deposition techniques such as sputtering, CVD and the like.

The semiconductor device 100 shown in FIG. 1 further comprises an inter-layer dielectric (ILD) layer 114. The ILD layer 114 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art, such as spin coating, CVD and the like.

The resistor device 150 may be formed by a composite film. In some embodiments, the composite film of the resistor device 150 is formed of the same materials as the composite film of the metal gate structure 160. The detailed formation of the resistor device 150 will be described below with respect to FIGS. 2-10.

Figure 2:
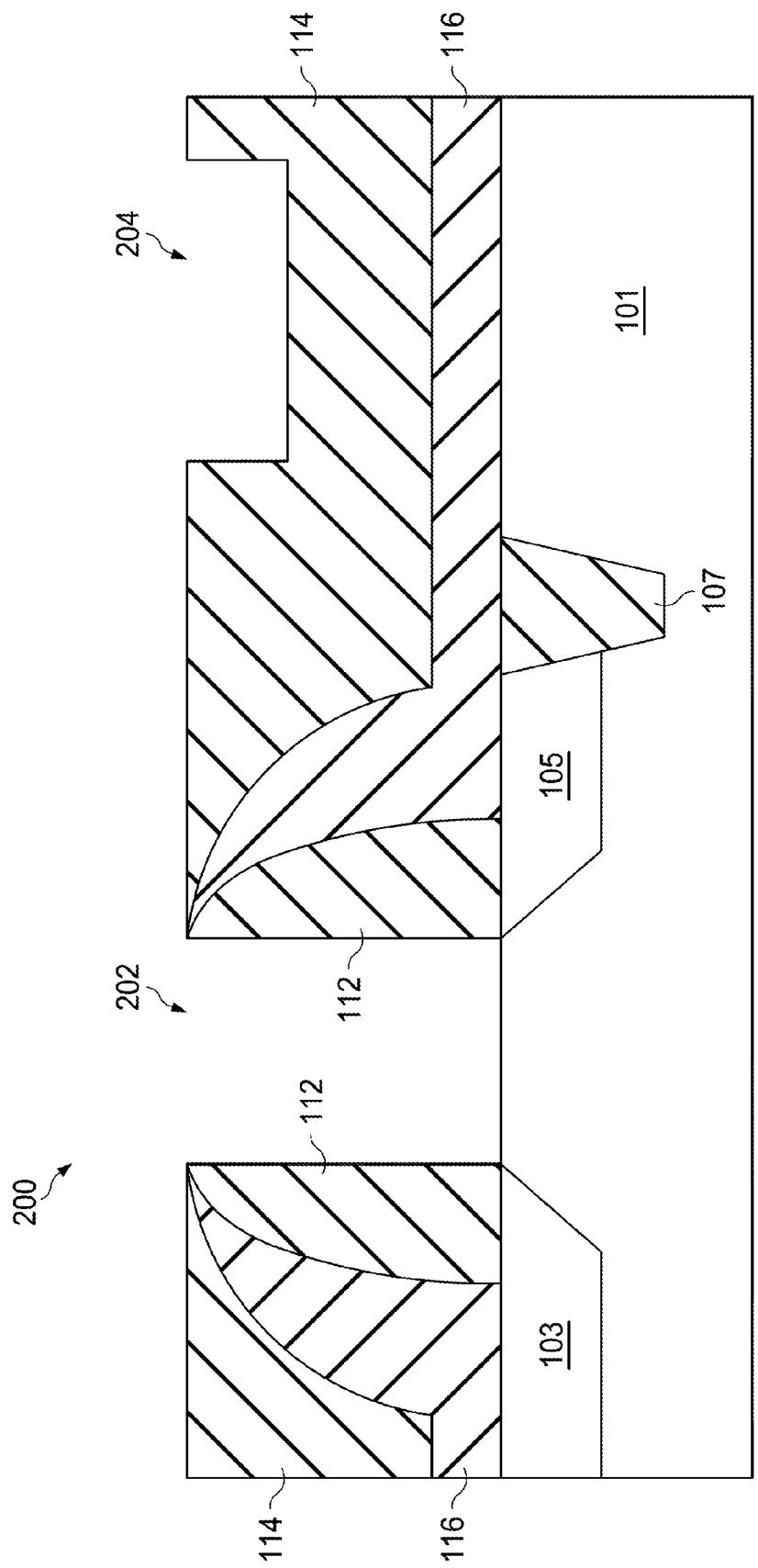
FIG. 2 illustrates a cross sectional view of a semiconductor device after a patterning process is applied to the semiconductor device in accordance with various embodiments of the present disclosure.

The resistor device 150 is formed in a resistor trench (shown in FIG. 2). The resistor device 150 is formed by four films, namely, films 123, 125, 127 and 129 as shown in FIG. 1. The resistor device 150 may be of a different resistance value by adjusting the materials of the films (e.g., the film 123). In addition, the resistance value of the resistor device 150 may be adjustable through controlling the thickness of the composite film. The thickness of the composite film may change through adjusting the depth of the resistor trench.

As shown in FIG. 1, there may be an isolation region 107 formed between the MOS transistor 110 and the resistor device 150. The isolation regions 107 may be shallow trench isolation (STI) regions, and may be formed by etching the substrate 101 to form a trench and filling the trench with a dielectric material as is known in the art. For example, the isolation regions 107 may be filled with a dielectric material such as an oxide material, a high-density plasma (HDP) oxide and/or the like. A planarization process such as a chemical mechanical polish (CMP) process may be applied to the top surface so that the excess dielectric material may be removed as a result.

FIGS. 2-10 are cross sectional views of intermediate stages in the making of a metal gate structure and a resistor in accordance with various embodiments of the present disclosure.

FIG. 2 illustrates a cross sectional view of a semiconductor device after a patterning process is applied to the semiconductor device in accordance with various embodiments of the present disclosure. As shown in FIG. 2, the semiconductor device 200 is similar to the semiconductor device 100 shown in FIG. 1 except that the metal gate structure 160 and the resistor device 150 are not formed over the substrate 101 yet.

As shown in FIG. 2, a first opening 202 may be formed between the gate spacers 112. A second opening 204 may be formed into the ILD layer 114. The first opening 202 may be formed by removing a dummy gate electrode layer. In some embodiments, the dummy gate electrode layer may be removed by suitable etching techniques such as a dry etching process, a wet etching process and the like. The second opening 204 may be formed by applying and developing a suitable photoresist layer (not shown), and removing the portion of the ILD layer 114 that is exposed to the desired depth. Throughout the description, the first opening 202 is alternatively referred to as the gate trench 202. The second opening 204 is alternatively referred to as the resistor trench 204.

Figure 3:
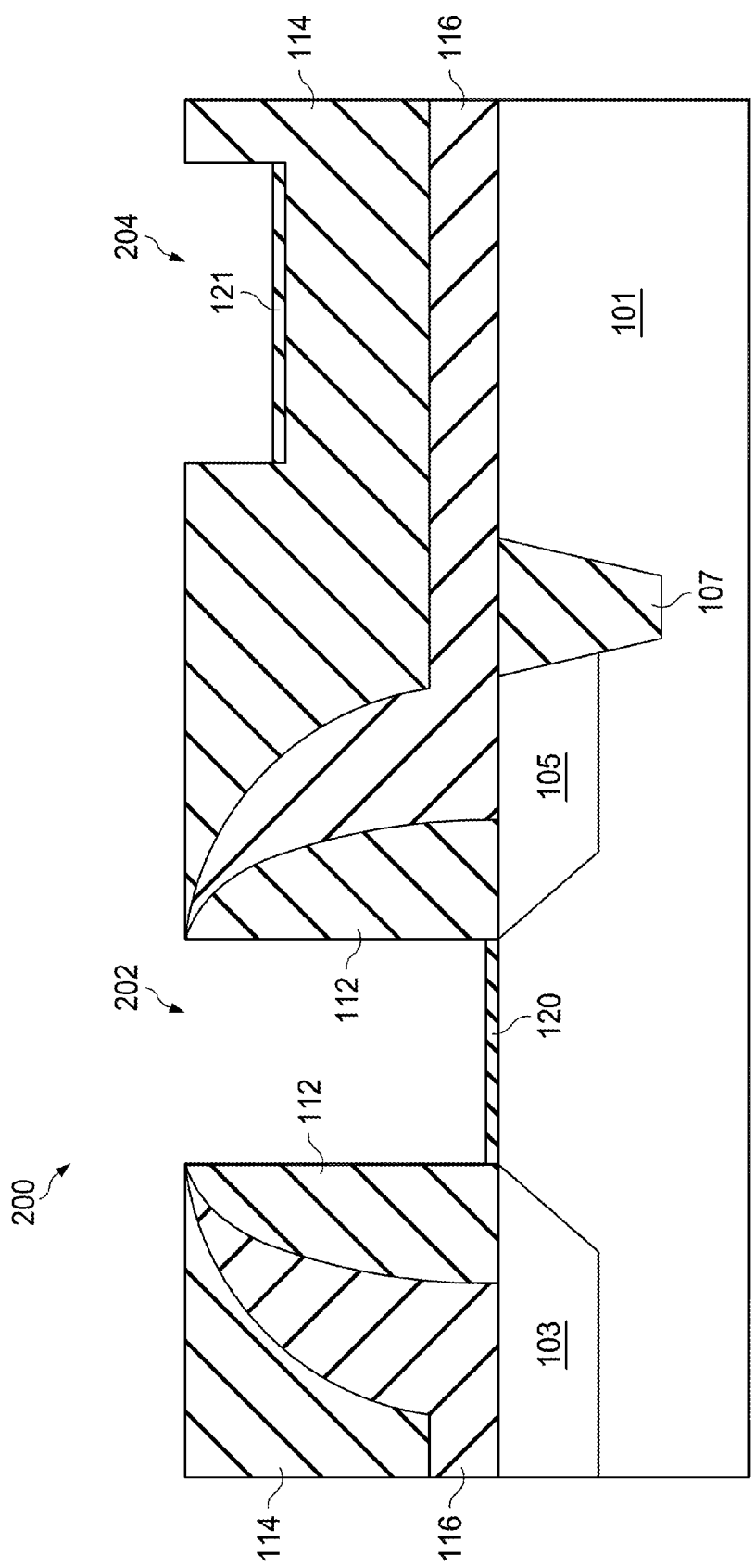
FIG. 3 illustrates a cross sectional view of the semiconductor device shown in FIG. 2 after barrier layers are formed on the bottoms of the openings in accordance with various embodiments of the present disclosure.

FIG. 3 illustrates a cross sectional view of the semiconductor device shown in FIG. 2 after barrier layers are formed on the bottoms of the openings in accordance with various embodiments of the present disclosure. Once the openings 202 and 204 have been formed, the bottoms of the openings 202 and 204 may be deposited with a barrier layer. As shown in FIG. 3, the barrier layers 120 and 121 are formed in the openings 202 and 204 respectively. The barrier layers 120 and 121 may be formed of suitable dielectric materials such as silicon oxide, silicon nitride, silicate based and the like.

The barrier layers 120 and 121 may be formed using suitable fabrication processes such as a CVD process, although other suitable processes, such as PVD, a thermal process and/or the like, may alternatively be used.

Figure 4:
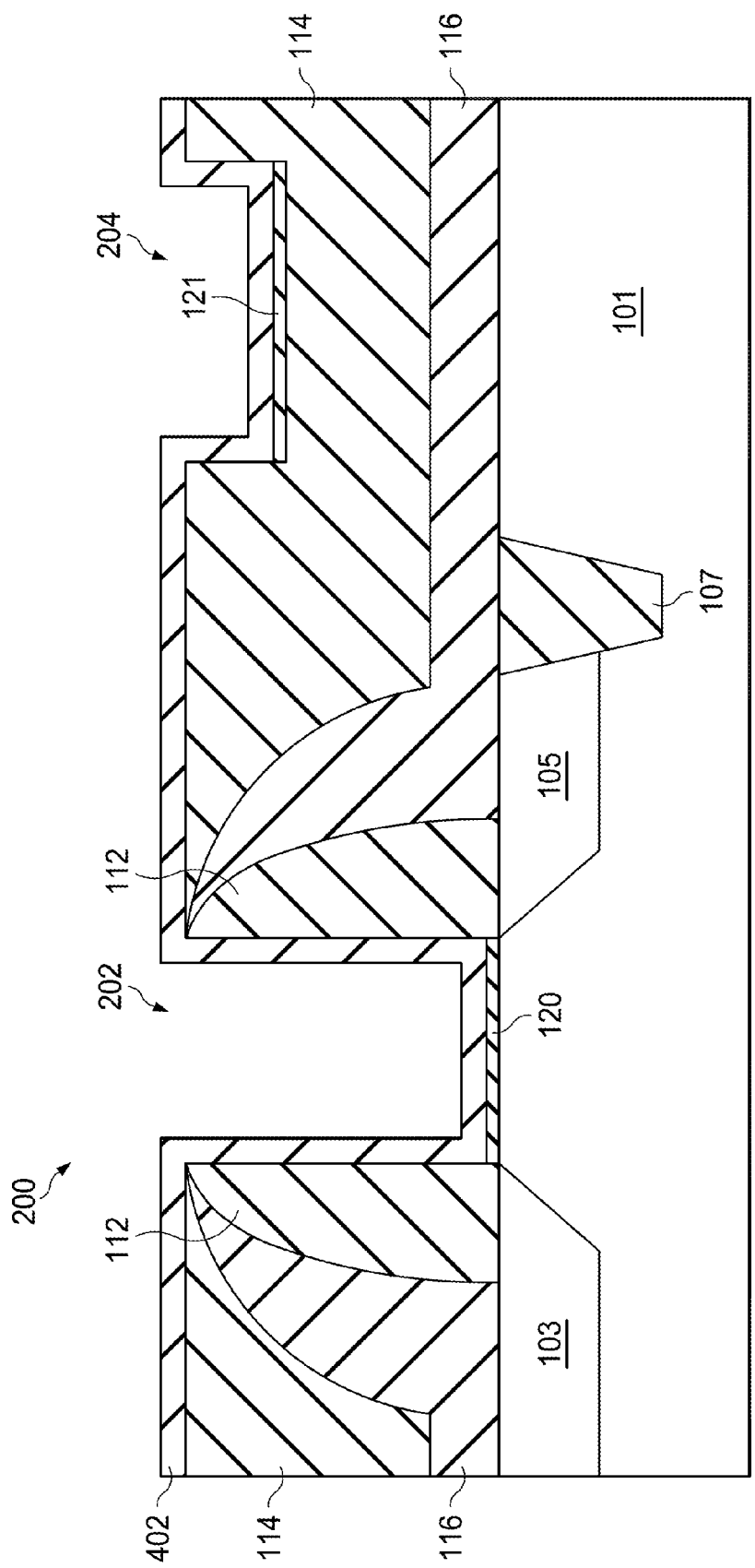
FIG. 4 illustrates a cross sectional view of the semiconductor device shown in FIG. 3 after a first film is deposited in the openings in accordance with various embodiments of the present disclosure.

FIG. 4 illustrates a cross sectional view of the semiconductor device shown in FIG. 3 after a first film is deposited in the openings in accordance with various embodiments of the present disclosure. The first film 402 may be deposited on the barrier layers, the sidewalls of the openings as well as the top surface of the ILD layer 114. The first film 402 may be formed of titanium nitride (TiN), tantalum nitride (TaN), titanium aluminide (TiAl), any combinations thereof and the like. Alternatively, the first film 402 may be formed of some suitable dielectric materials such as silicon oxide (SiOx), hafnium oxide (HfOx), lanthanum oxide (LaOx), any combinations thereof and the like. The first film 402 may be formed by using suitable deposition techniques such as CVD and/or the like.

Figure 5:
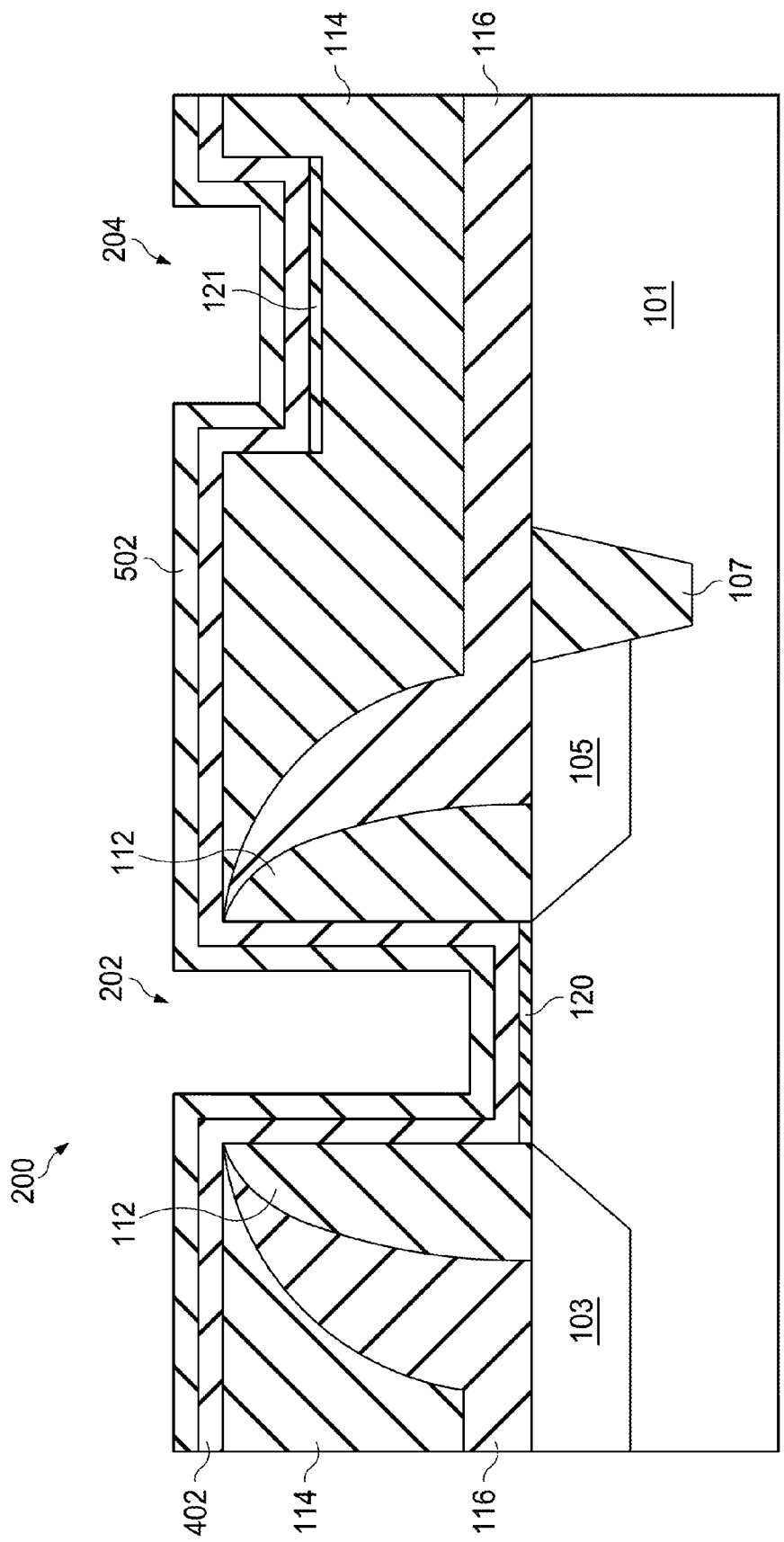
FIG. 5 illustrates a cross sectional view of the semiconductor device shown in FIG. 4 after a second film is deposited in the openings in accordance with various embodiments of the present disclosure.

FIG. 5 illustrates a cross sectional view of the semiconductor device shown in FIG. 4 after a second film is deposited in the openings in accordance with various embodiments of the present disclosure. As shown in FIG. 5, the second film 502 is deposited on the bottoms as well as the sidewalls of the gate trench 202 and the resistor trench 204. The formation of the second film 502 is similar to that of the first film 402 shown in FIG. 4, and hence is not discussed again to avoid unnecessary repetition.

Figure 6:
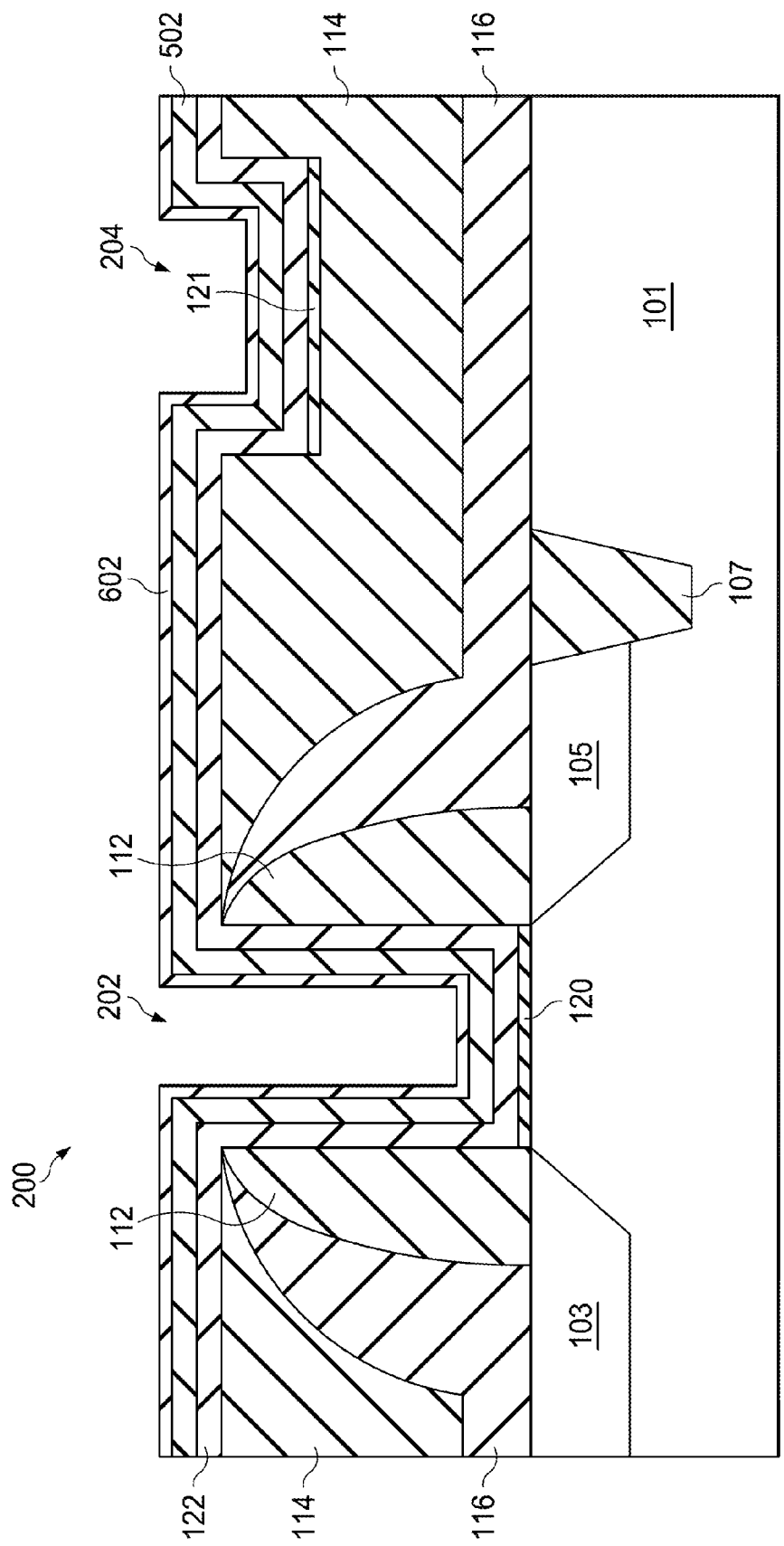
FIG. 6 illustrates a cross sectional view of the semiconductor device shown in FIG. 5 after a third film is deposited in the openings in accordance with various embodiments of the present disclosure.

FIG. 6 illustrates a cross sectional view of the semiconductor device shown in FIG. 5 after a third film is deposited in the openings in accordance with various embodiments of the present disclosure. As shown in FIG. 6, the third film 602 is deposited over the second film 502. The formation of the third film 602 is similar to that of the first film 402 shown in FIG. 4, and hence is not discussed again to avoid unnecessary repetition.

Figure 7:
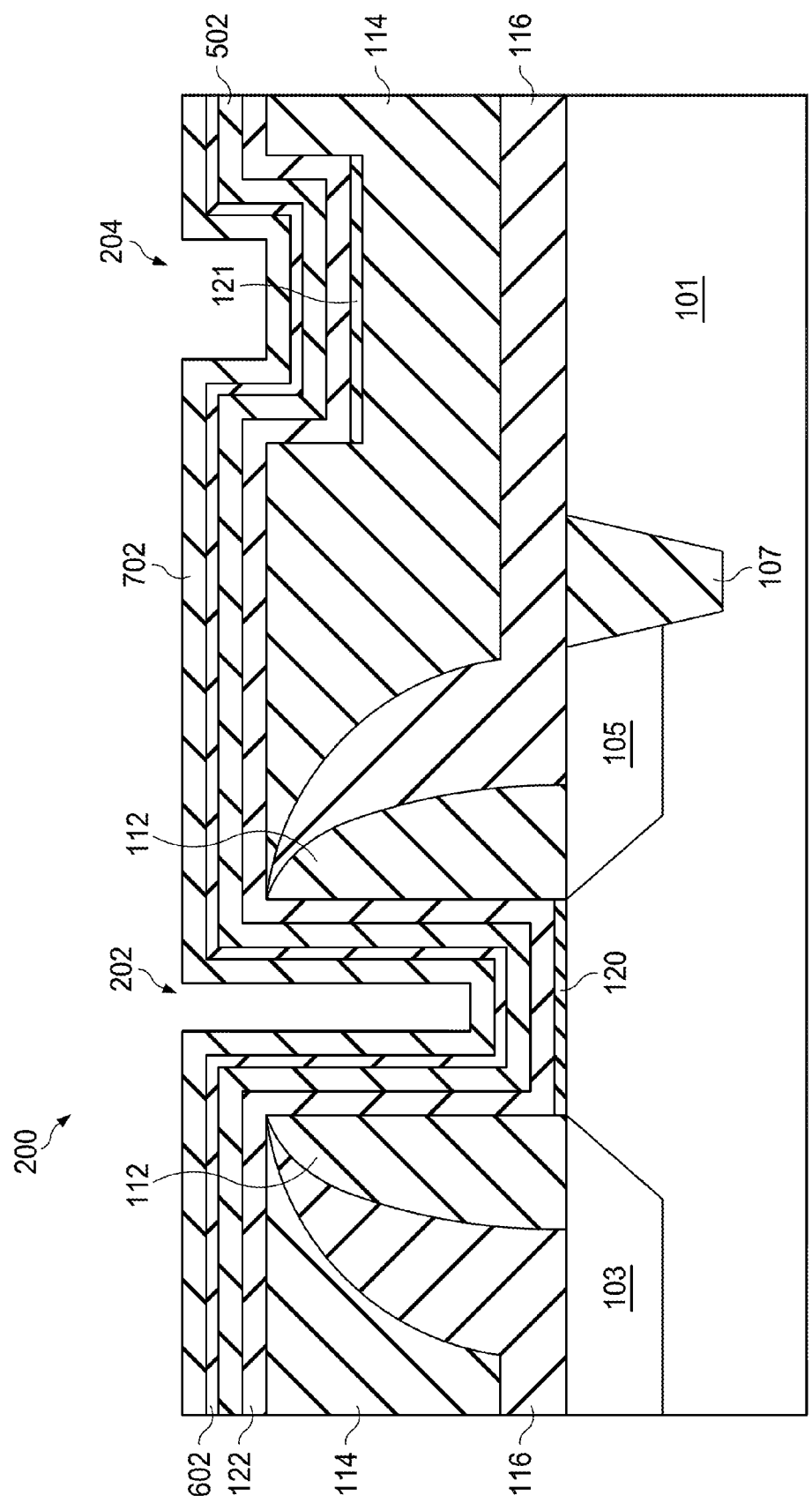
FIG. 7 illustrates a cross sectional view of the semiconductor device shown in FIG. 6 after a fourth film is deposited in the openings in accordance with various embodiments of the present disclosure.

FIG. 7 illustrates a cross sectional view of the semiconductor device shown in FIG. 6 after a fourth film is deposited in the openings in accordance with various embodiments of the present disclosure. As shown in FIG. 7, the fourth film 702 is deposited over the third film 602. The formation of the fourth film 702 is similar to that of the first film 402 shown in FIG. 4, and hence is not discussed again to avoid unnecessary repetition.

Figure 8:
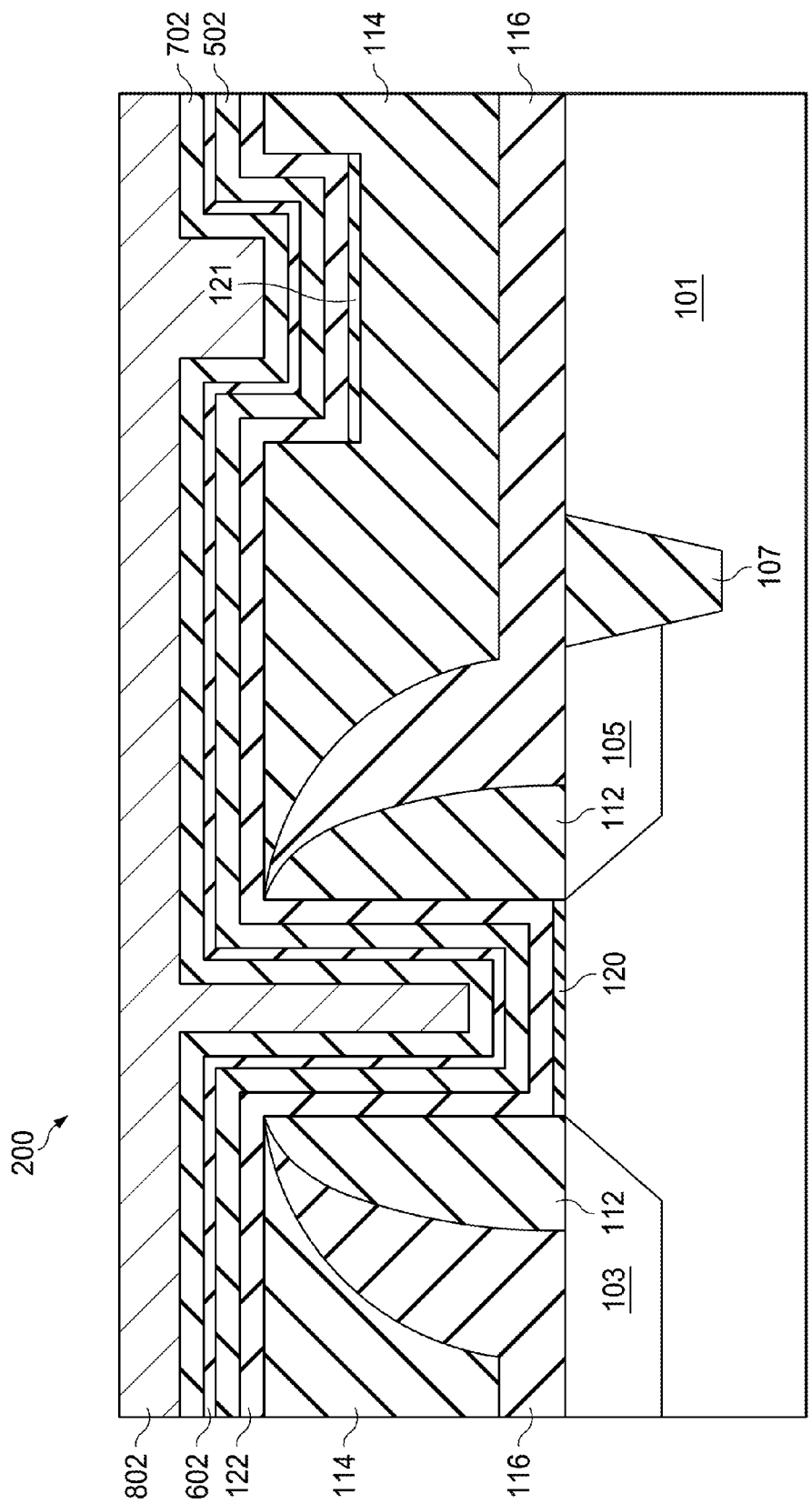
FIG. 8 illustrates a cross sectional view of the semiconductor device shown in FIG. 7 after a gate electrode layer is deposited in the openings in accordance with various embodiments of the present disclosure.

FIG. 8 illustrates a cross sectional view of the semiconductor device shown in FIG. 7 after a gate electrode layer is deposited in the openings in accordance with various embodiments of the present disclosure. The gate electrode layer 802 may be made of metallic materials such as copper, copper alloys, aluminum, silver, gold and any combinations thereof, and/or multi-layers thereof. The gate electrode layer 802 may be formed by suitable techniques such as CVD. Alternatively, the gate electrode layer 802 may be formed by sputtering, electroplating and/or the like.

Figure 9:
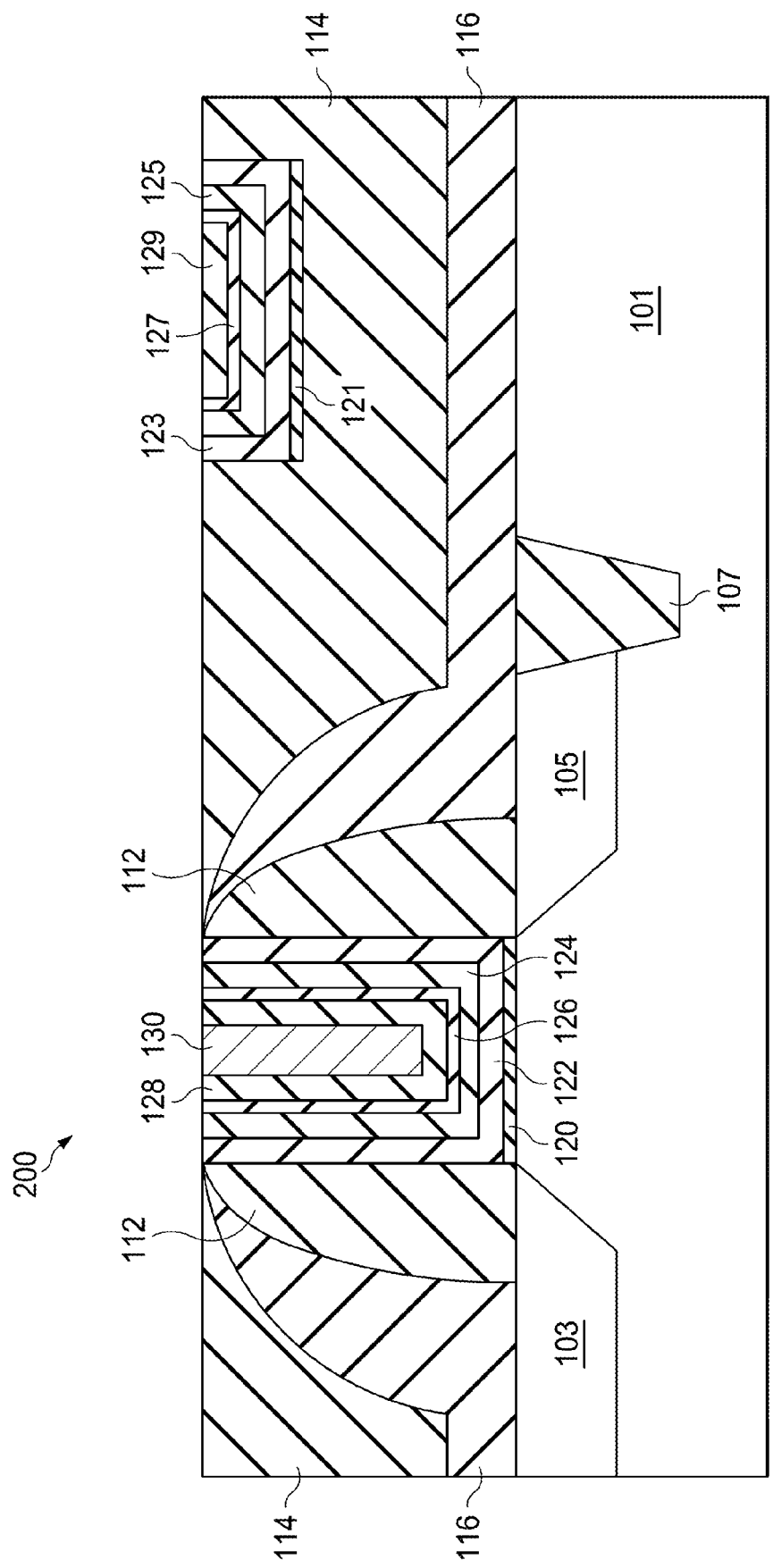
FIG. 9 illustrates a cross sectional view of the semiconductor device shown in FIG. 8 after a CMP process is applied to the semiconductor device in accordance with various embodiments of the present disclosure.

FIG. 9 illustrates a cross sectional view of the semiconductor device shown in FIG. 8 after a CMP process is applied to the semiconductor device in accordance with various embodiments of the present disclosure. Once the gate electrode layer 802 is formed over the semiconductor device, excess portions of the conductive material are removed from the top surface of the ILD layer 114 by using a planarization process such as CMP. In the CMP process, a combination of etching materials and abrading materials are put into contact with the gate electrode layer 802 and a grinding pad (not shown) is used to grind away the gate electrode layer 802 until the fourth film 702 of the resistor trench 204 is exposed.

After the CMP process is applied to the semiconductor device, the gate electrode layer is removed from the resistor trench. A composite layer including films 123, 125, 127 and 129 is left in the resistor trench. The composite layer in the resistor trench may function as a resistor.

In comparison with doped poly-silicon resistors commonly used in the semiconductor industry, the formation process of the resistor shown in FIG. 9 is integrated with the formation of the metal gate structure of the MOS transistor. As such, the fabrication of the resistor is simplified. Such a simplified process helps to further reduce the cost of fabricating semiconductor devices and improve the reliability of the semiconductor devices.

Figure 10:
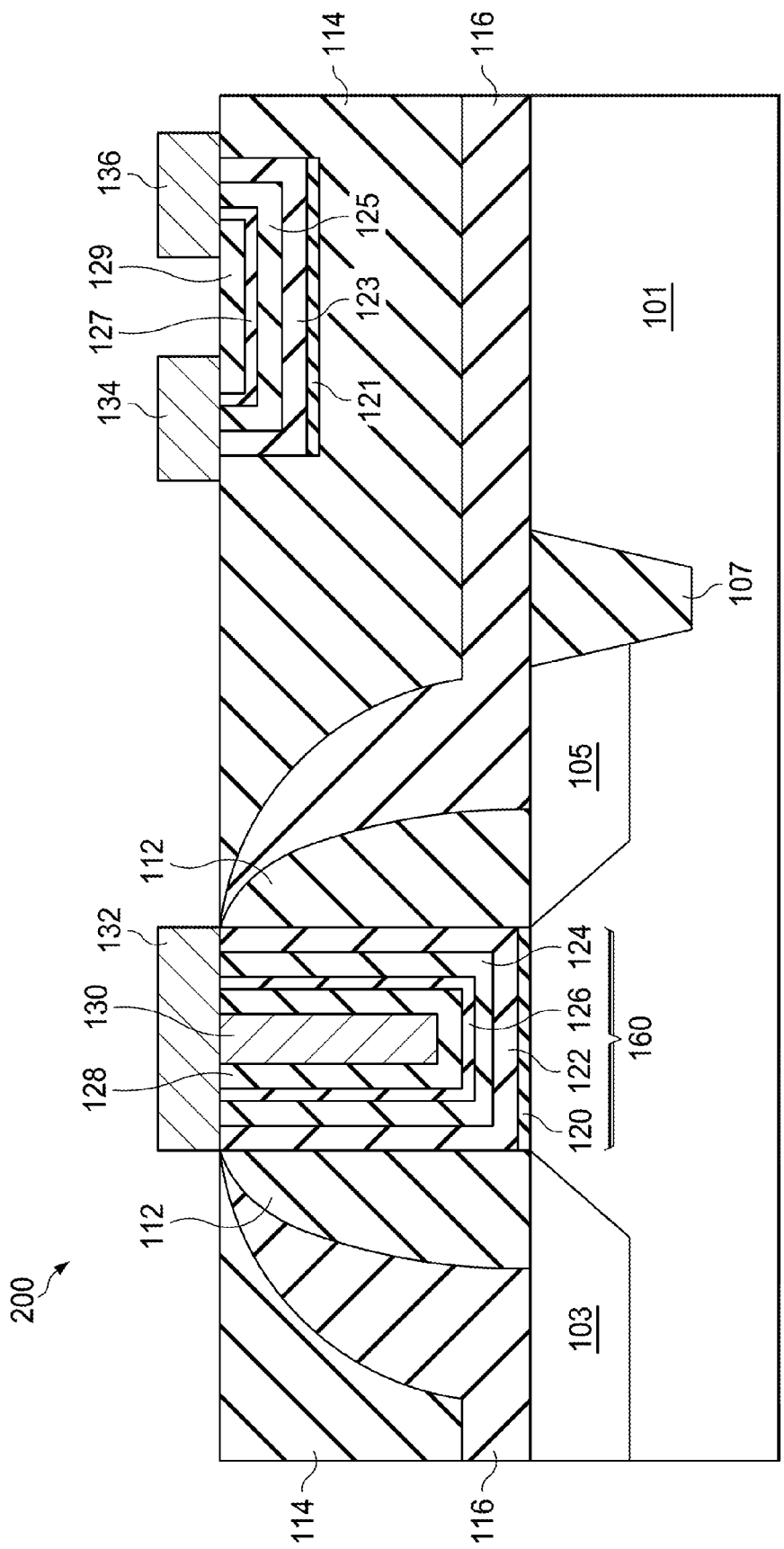
FIG. 10 illustrates a cross sectional view of the semiconductor device shown in FIG. 9 after three contacts have been formed over the semiconductor device in accordance with various embodiments of the present disclosure.

FIG. 10 illustrates a cross sectional view of the semiconductor device shown in FIG. 9 after three contacts have been formed over the semiconductor device in accordance with various embodiments of the present disclosure. The contact 132 is formed over the metal gate structure and coupled to the gate electrode 130. The contacts 134 and 136 are coupled to two terminals of the resistor.

The contacts 132, 134 and 136 may be formed of any suitable conductive material, such as a highly-conductive, low-resistive metal, elemental metal, transition metal, or the like. In an exemplary embodiment the contacts 132, 134 and 136 are formed of tungsten, although other materials, such as copper, could alternatively be utilized. In an embodiment in which the contacts 132, 134 and 136 are formed of tungsten, the contacts 132, 134 and 136 may be deposited by CVD techniques known in the art, although any method of formation could alternatively be used.

In accordance with an embodiment, an apparatus comprises a metal gate structure formed in a substrate, wherein the metal gate structure comprises a first film formed of a first material and formed on a bottom and sidewalls of a gate trench, a second film formed of a second material and formed over the first film and a gate electrode formed over the second film. The apparatus further comprises a resistor structure formed in the substrate, where the resistor structure comprises a third film formed of the first material and formed on a bottom and sidewalls of a resistor trench and a fourth film formed of the second material and formed over the third film.

In accordance with an embodiment, a method comprises a metal oxide semiconductor (MOS) device and a resistor on a substrate. The MOS device comprises a first drain/source region, a second drain/source region and a gate structure comprising a first film formed of a first material and formed on a bottom and sidewalls of a gate trench, a second film formed of a second material and formed over the first film and a gate electrode formed over the second film.

The resistor comprises a third film formed of the first material and formed on a bottom and sidewalls of a resistor trench and a fourth film formed of the second material and formed over the third film.

In accordance with an embodiment, a method comprises forming a gate trench between a plurality of gate spacers over a substrate, forming a resistor trench over the substrate, depositing a first layer on a bottom of the gate trench, a bottom of the resistor trench, sidewalls of the gate trench and sidewalls of the resistor trench, depositing a second layer over the first layer, depositing a gate electrode layer over the second layer and applying a chemical mechanical polish process to the gate electrode layer until the gate electrode layer is removed from the resistor trench.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure comprising:
a metal gate structure formed in a dielectric layer over a substrate having a top surface in direct contact with a bottom surface of the dielectric layer, wherein the metal gate structure comprises:
a first film formed of a first material and formed on a bottom and sidewalls of a gate trench;
a second film formed of a second material and formed over the first film; and
a gate electrode formed over the second film; and
a resistor structure formed in the dielectric layer over the substrate, wherein a bottom surface of the resistor structure and the top surface of the substrate are separated by the dielectric layer, and wherein the resistor structure comprises:
a third film formed of the first material and formed on a bottom and sidewalls of a resistor trench, wherein a bottom portion of the third film is higher than a bottom portion of the first film; and
a fourth film formed of the second material and formed over sidewall portions and the bottom portion of the third film.

2. The structure of claim 1, further comprising:
a plurality of gate spacers;
a first barrier layer, wherein the first barrier layer is formed on the bottom of the gate trench;
a second barrier layer, wherein the second barrier layer is formed on the bottom of the resistor trench; and
the dielectric layer, wherein the dielectric layer is formed adjacent to the plurality of gate spacers.

3. The structure of claim 1, wherein:
the first film is of a first thickness;
the second film is of a second thickness;
the third film is of the first thickness; and
the fourth film is of the second thickness.

4. The structure of claim 1, wherein:
the gate electrode is formed of a conductive material.

5. The structure of claim 1, further comprising:
a fifth film formed between the second film and the gate electrode; and
a sixth film formed over the fourth film.

6. The structure of claim 5, wherein:
the fifth film is formed of a third material; and
the sixth film is formed of the third material.

7. A device comprising:
a metal oxide semiconductor (MOS) device on a substrate, wherein the MOS device comprises:
a first drain/source region;
a second drain/source region; and
a gate structure in a dielectric layer over the substrate having a top surface in direct contact with a bottom surface of the dielectric layer, wherein the gate structure comprises:
a first film formed of a first material and formed on a bottom and sidewalls of a gate trench;
a second film formed of a second material and formed over the first film; and
a gate electrode formed over the second film; and
a resistor formed in the dielectric layer over the substrate, wherein a bottom surface of the resistor and the top surface of the substrate are separated by the dielectric layer, wherein the resistor comprises:
a third film formed of the first material and formed on a bottom and sidewalls of a resistor trench, wherein a bottom portion of the third film is higher than a bottom portion of the first film; and
a fourth film formed of the second material and formed over sidewall portions and the bottom portion of the third film.

8. The device of claim 7, wherein:
the first drain/source region and the second drain/source region are formed on opposite sides of the gate structure.

9. The device of claim 7, further comprising:
an isolation region formed between the MOS device and the resistor.

10. The device of claim 7, wherein
a thickness of the first film is equal to a thickness of the third film; and
a thickness of the second film is equal to a thickness of the fourth film.

11. The device of claim 7, further comprising:
a first contact formed over the gate electrode;
a second contact formed over a first terminal of the resistor; and
a third contact formed over a second terminal of the resistor.

12. The device of claim 7, further comprising:
a fifth film formed over the second film;
a sixth film formed between the fifth film and the gate electrode;
a seventh film formed over the fourth film, wherein the seventh film and the fifth film are formed of a same material; and
an eighth film formed over the seventh film, wherein the sixth film and the eighth film are formed of a same material.

13. The device of claim 12, wherein
a thickness of the fifth film is equal to a thickness of the seventh film; and
a thickness of the sixth film is equal to a thickness of the eighth film.

* * * * *